(12) United States Patent
Iijima

(10) Patent No.: US 10,446,464 B2
(45) Date of Patent: Oct. 15, 2019

(54) ELECTRONIC DEVICE AND JOINED MEMBER

(71) Applicant: SONY CORPORATION, Tokyo (JP)

(72) Inventor: Toshiyuki Iijima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/580,579

(22) PCT Filed: May 2, 2016

(86) PCT No.: PCT/JP2016/063551
§ 371 (c)(1),
(2) Date: Dec. 7, 2017

(87) PCT Pub. No.: WO2016/203859
PCT Pub. Date: Dec. 22, 2016

(65) Prior Publication Data
US 2018/0182684 A1    Jun. 28, 2018

(30) Foreign Application Priority Data

Jun. 18, 2015 (JP) .................................. 2015-122533

(51) Int. Cl.
*H01L 23/36* (2006.01)
*H01L 23/34* (2006.01)
(Continued)

(52) U.S. Cl.
CPC .......... *H01L 23/3675* (2013.01); *H01L 23/34* (2013.01); *H01L 23/3672* (2013.01);
(Continued)

(58) Field of Classification Search
CPC ... H01L 23/3675; H01L 23/34; H01L 23/345; H01L 23/4043; H01L 23/405
See application file for complete search history.

(56) References Cited

U.S. PATENT DOCUMENTS

| 6,278,607 | B1 * | 8/2001 | Moore | G06F 1/203 |
| | | | | 361/679.54 |
| 9,496,188 | B2 * | 11/2016 | Eckert | H01L 22/12 |
| 9,534,592 | B2 * | 1/2017 | Tsuboi | H01H 37/58 |

FOREIGN PATENT DOCUMENTS

| EP | 2584604 A1 * | 4/2013 | ............. H01L 23/42 |
| JP | 2003-240397 | 8/2003 | |

(Continued)

OTHER PUBLICATIONS

International Search Report prepared by the Japan Patent Office dated May 30, 2016, for International Application No. PCT/JP2016/063551.

*Primary Examiner* — Ida M Soward
(74) *Attorney, Agent, or Firm* — Sheridan Ross P.C.

(57) ABSTRACT

To cooled down a circuit to an appropriate temperature. An electronic device is provided with a low-temperature-side deformation member, and a high-temperature-side deformation member. In this electronic device, when a temperature of a circuit to be cooled becomes higher than a set temperature that is lower between two different set temperatures, the low-temperature-side deformation member deforms, and comes in contact with a heat dissipation member having a smaller heat capacity between two heat dissipation members having different heat capacities. In addition, when the temperature of the circuit becomes higher than a set temperature that is higher between the two different set temperatures, the high-temperature-side deformation member deforms, and comes in contact with a heat dissipation member having a larger heat capacity between the two heat dissipation members.

8 Claims, 6 Drawing Sheets

(51) Int. Cl.
  *H01L 23/40* (2006.01)
  *H01L 23/367* (2006.01)
  *H01L 23/373* (2006.01)
  *F28F 13/00* (2006.01)
  *H01L 25/11* (2006.01)

(52) U.S. Cl.
  CPC .... *H01L 23/3736* (2013.01); *F28F 2013/006* (2013.01); *H01L 23/345* (2013.01); *H01L 25/115* (2013.01); *H01L 2224/73253* (2013.01)

(56) References Cited

FOREIGN PATENT DOCUMENTS

| | | | |
|---|---|---|---|
| JP | 2008-117809 | 5/2005 | |
| JP | 2009-193350 | 8/2009 | |
| JP | 2014-110084 | 6/2014 | |
| WO | WO-2014016323 A1 * | 1/2014 | ............. H01L 35/08 |

* cited by examiner

FIG. 2
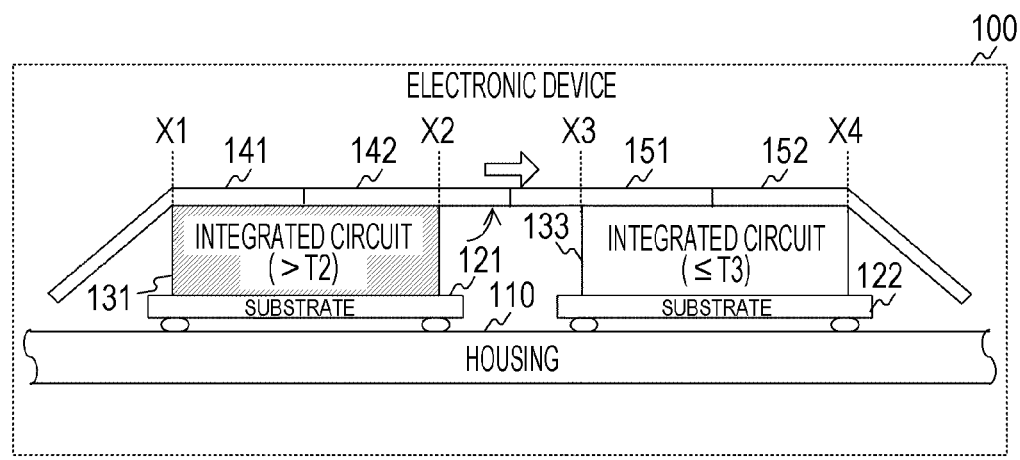
a
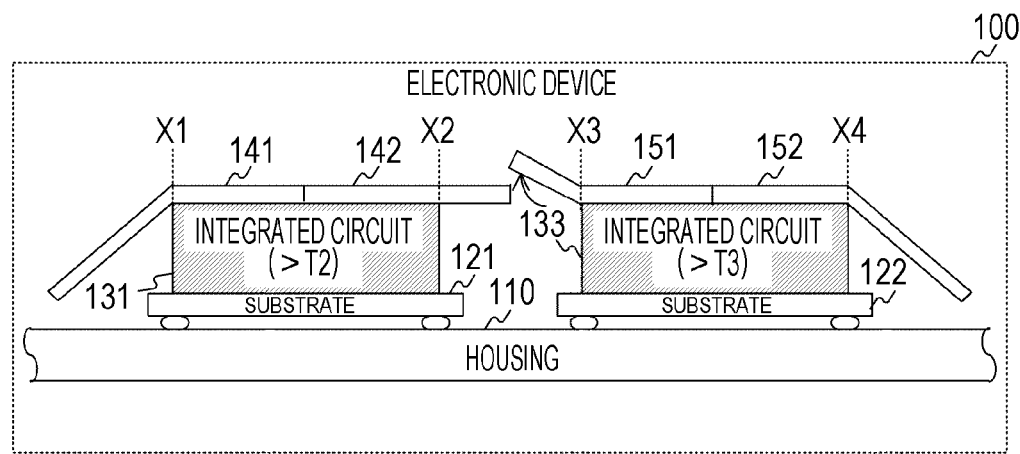
b

FIG. 3
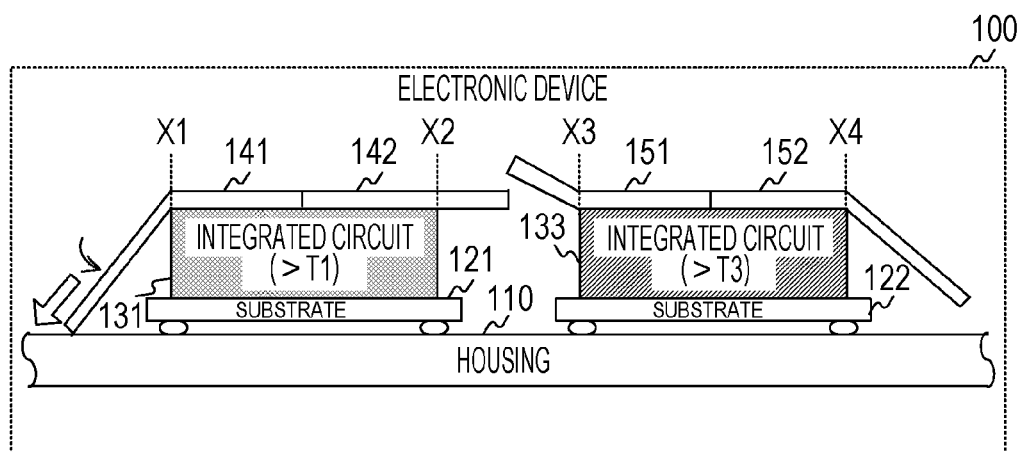
a
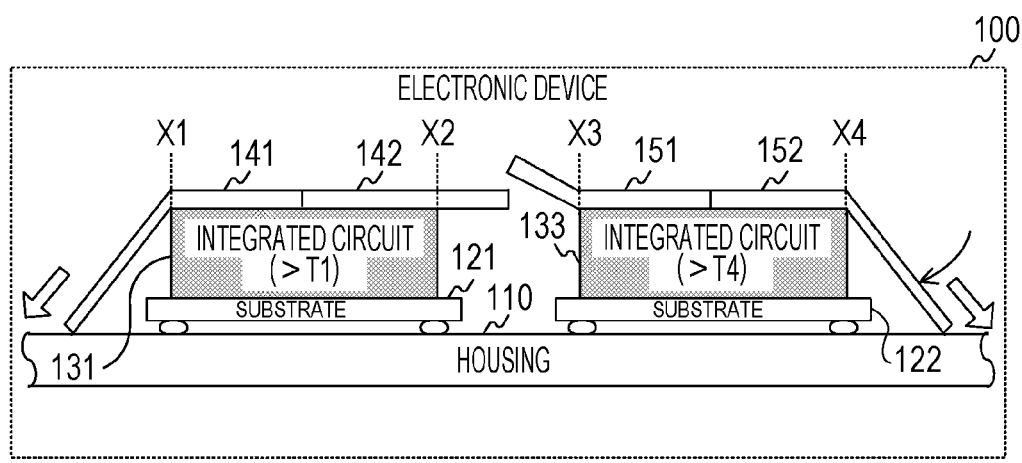
b

ELECTRONIC DEVICE AND JOINED MEMBER

CROSS REFERENCE TO RELATED APPLICATIONS

This application is a national stage application under 35 U.S.C. 371 and claims the benefit of PCT Application No. PCT/JP2016/063551 having an international filing date of 2 May 2016, which designated the United States, which PCT application claimed the benefit of Japanese Patent Application No. 2015-122533 filed 18 Jun. 2015, the disclosures of which are incorporated herein by reference in their entirety.

TECHNICAL FIELD

The present technology relates to an electronic device and a joined member. More specifically, the present technology relates to an electronic device that cools down a circuit, and to a joined member.

BACKGROUND ART

In recent years, along with further miniaturization of circuits in a manufacturing process, a higher degree of circuit integration can be achieved, and therefore it is common for a microprocessor and Large Scale Integration (LSI) for image processing to have a scale that exceeds several tens of millions of gates. In addition, in order to speed up processing, a frequency of an operation clock of each circuit more and more increases. In particular, in a case where an LSI executes heavy load processing such as video image processing, a gate activation rate rapidly increases, which causes the power consumption to increase, and consequently the temperature of the LSI increases. It is known that in general, an increase in temperature delays the operation speed of an electronic circuit such as an LSI, and extremely shortens the product lifetime of the electronic circuit. Moreover, when the temperature of the electronic circuit reaches such a high temperature that exceeds a temperature range within which the operation is guaranteed, the electronic circuit itself is broken in the worst case. Therefore, cooling of the electronic circuit is required to prevent the breakage.

There is proposed, for example, a device in which a shape memory alloy is mounted to an electronic circuit, the shape memory alloy deforming when the temperature exceeds a certain temperature, which causes the shape memory alloy to come in contact with a heat exchanger (refer to, for example, Patent Document 1). Heat of the electronic circuit is transferred to the heat exchanger through this shape memory alloy, and the heat is radiated from the heat exchanger to the outside air. This enables the device to cool down the electronic circuit without using a cooling fan or the like.

CITATION LIST

Patent Document

Patent Document 1: Japanese Patent Application Laid-Open No. 2003-240397

SUMMARY OF THE INVENTION

Problems to be Solved by the Invention

However, in the above-described prior art, when a decrease in outside air temperature causes the temperature of the heat exchanger to become very low, the electronic circuit may be cooled down until the temperature of the electronic circuit reaches a low temperature level that is, for example, 0 degrees or lower. In this case, there is a possibility that the delay time of the electronic circuit will be lengthened in comparison with before cooling. A phenomenon in which delay characteristics of a circuit are worsened at low temperature in this manner is called low temperature worst. This low temperature worst occurs more remarkably with the further progress of LSI miniaturization, or with the decrease in power supply voltage.

In order to avoid the low temperature worst in the above-described device, it is possible to conceive of a configuration in which a temperature at which the shape memory alloy deforms is set at a relatively high temperature. However, this configuration creates a possibility that the electronic circuit will not be sufficiently cooled down in a temperature region until the shape memory alloy deforms, which will cause the operation to become unstable. Thus, it is difficult for the above-described device to cool down the circuit to an appropriate temperature.

The present technology has been devised in consideration of such a situation, and is intended for cooling down a circuit to an appropriate temperature.

Solutions to Problems

The present technology has been achieved to solve the above-described problems, and a first aspect thereof is an electronic device including: a low-temperature-side deformation member, when a temperature of a circuit to be cooled becomes higher than a set temperature that is lower between two different set temperatures, the low-temperature-side deformation member deforming, and coming in contact with a heat dissipation member having a smaller heat capacity between two heat dissipation members having different heat capacities; and a high-temperature-side deformation member, when the temperature of the circuit becomes higher than a set temperature that is higher between the two different set temperatures, the high-temperature-side deformation member deforming, and coming in contact with a heat dissipation member having a larger heat capacity between the two heat dissipation members. This produces an effect of, when the temperature of the circuit becomes higher than the set temperature that is lower, causing the low-temperature-side deformation member to deform, and when the temperature of the circuit becomes higher than the set temperature that is higher, causing the high-temperature-side deformation member to deform.

In addition, in the first aspect, at least one of the low-temperature-side deformation member and the high-temperature-side deformation member may be a shape memory alloy. This produces an effect of causing the shape memory alloy to deform.

In addition, in the first aspect, the electronic device may include: a low-temperature-side drive unit, when the temperature of the circuit becomes higher than the set temperature that is lower between the two different set temperatures, the low-temperature-side drive unit deforming the low-temperature-side deformation member; and a high-temperature-side drive unit, when the temperature of the circuit becomes higher than the set temperature that is higher between the two different set temperatures, the high-temperature-side drive unit deforming the high-temperature-side deformation member. This produces an effect of causing the low-temperature-side deformation member and the temperature-side deformation member to deform by the low-temperature-side drive unit and the high-temperature-side drive unit.

In addition, in the first aspect, at least one of the low-temperature-side drive unit and the high-temperature-side drive unit may be a shape memory alloy. This produces an effect of causing the low-temperature-side deformation member and the temperature-side deformation member to deform by the shape memory alloy.

In addition, in the first aspect, the electronic device may further include a temperature sensor that measures the temperature of the circuit, and causes at least one of the low-temperature-side drive unit and the high-temperature-side drive unit to be driven on the basis of the measured value. This produces an effect of causing at least one of the low-temperature-side drive unit and the high-temperature-side drive unit to be driven by the temperature sensor.

In addition, in the first aspect, the heat dissipation member having a larger heat capacity between the two heat dissipation members may be a housing that stores the low-temperature-side deformation member and the high-temperature-side deformation member. This produces an effect of causing the high-temperature-side deformation member to deform, and to come in contact with the housing.

Moreover, a second aspect of the present technology is an electronic device including: a first deformation member, when a temperature of a first circuit becomes higher than a first set temperature, the first deformation member deforming, and coming in contact with a predetermined heat dissipation member; a second deformation member, when the temperature of the first circuit becomes higher than a second set temperature that is lower than the first set temperature, the second deformation member deforming; a third deformation member, when a temperature of a second circuit becomes higher than a third set temperature that is between the first set temperature and the second set temperature, the third deformation member deforming into a shape that does not come in contact with the second deformation member after the deformation; and a fourth deformation member, when the temperature of the second circuit becomes higher than a fourth set temperature that is higher than the third set temperature, the fourth deformation member deforming, and coming in contact with the predetermined heat dissipation member. This produces an effect of causing the first, second, third and fourth deformation members to deform by the set temperatures that differ from one another.

Furthermore, a third aspect of the present technology is a joined member that is formed by joining together: a low-temperature-side deformation member, when a temperature of a circuit to be cooled becomes higher than a set temperature that is lower between two different set temperatures, the low-temperature-side deformation member deforming, and coming in contact with a heat dissipation member having a smaller heat capacity between two heat dissipation members having different heat capacities; and a high-temperature-side deformation member, when the temperature of the circuit becomes higher than a set temperature that is higher between the two different set temperatures, the high-temperature-side deformation member deforming, and coming in contact with a heat dissipation member having a larger heat capacity between the two heat dissipation members. This produces an effect of, when the temperature of the circuit becomes higher than the set temperature that is lower, causing the low-temperature-side deformation member to deform, and when the temperature of the circuit becomes higher than the set temperature that is higher, causing the high-temperature-side deformation member to deform.

Effects of the Invention

According to the present technology, an excellent effect of enabling a circuit to be cooled down to an appropriate temperature can be exhibited. It should be noted that the effect described herein is not necessarily limited, and may be any one of the effects described in the present disclosure.

BRIEF DESCRIPTION OF DRAWINGS

FIG. 2 shows diagrams each illustrating a cooling method at low temperature in the embodiment.

FIG. 3 shows diagrams each illustrating a cooling method at high temperature in the embodiment.

MODE FOR CARRYING OUT THE INVENTION

Modes for carrying out the present technology (hereinafter referred to as embodiment) will be described below. The description will be made in the following order.

1. Embodiment (an example in which two shape memory alloys deform)

2. First modified example (an example in which a shape memory alloy deforms two elastic members)

3. Second modified example (an example in which an actuator deforms two elastic members)

4. Third modified example (an example in which two shape memory alloys fixed to a plurality of integrated circuits deform)

5. Fourth modified example (an example in which two shape memory alloys deform, and come in contact with a radiator and a housing)

6. Fifth modified example (an example in which three shape memory alloys deform)

<1. First Embodiment>

[Configuration Example of Electronic Device]

Figure 1:
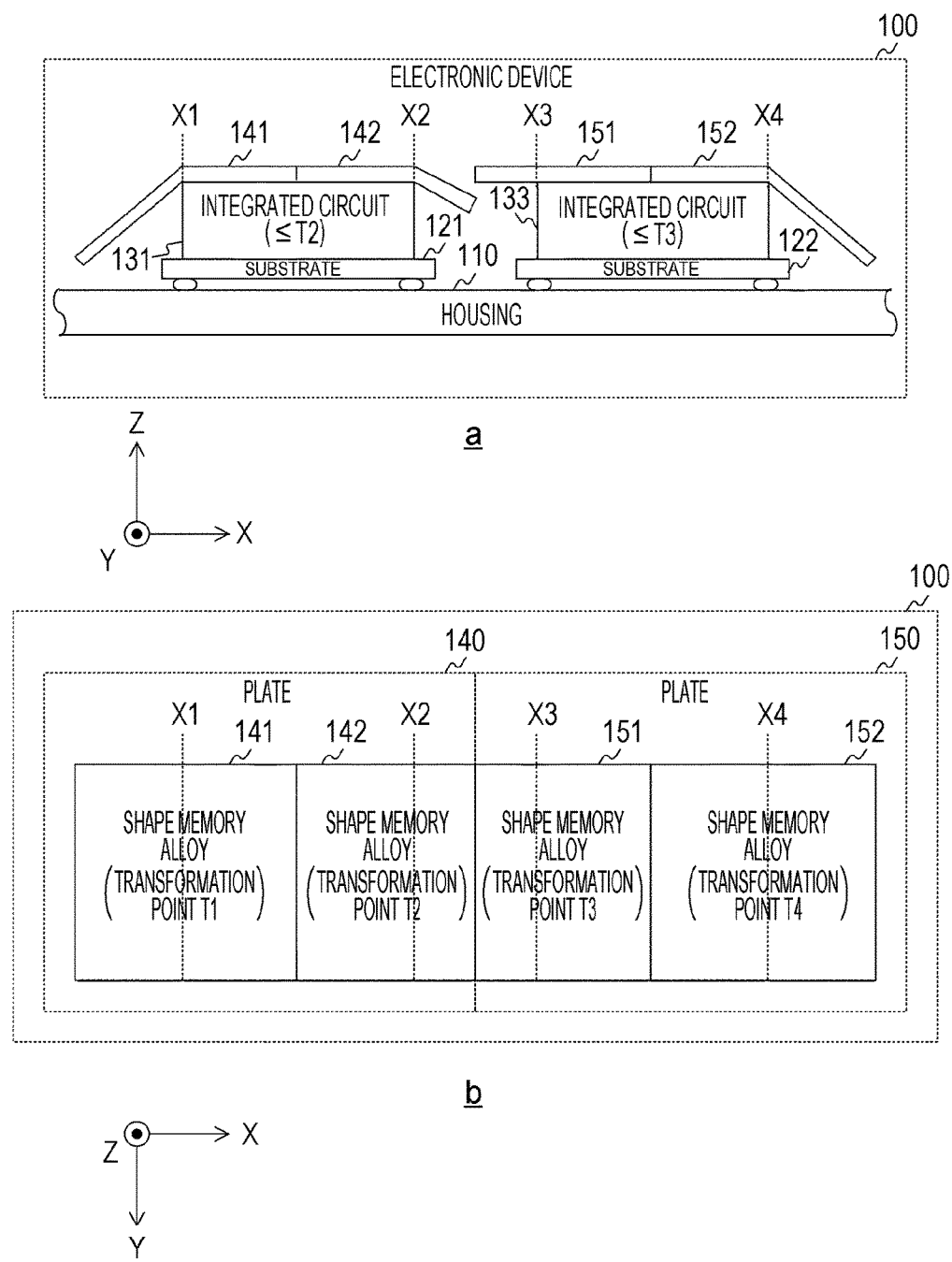
FIG. 1 shows, as an example, a cross-sectional view and a top view of an electronic device in an embodiment.

FIG. 1 shows, as an example, a cross-sectional view and a top view of an electronic device 100 in an embodiment. In FIG. 1, a shows an example of a cross-sectional view of the electronic device 100; and b shows an example of a top view of the electronic device 100. This electronic device 100 is provided with a housing 110, substrates 121 and 122, integrated circuits 131 and 133, and plates 140 and 150. The plate 140 is formed of shape memory alloys 141 and 142; and the plate 150 is formed of shape memory alloys 151 and 152.

The housing 110 is a member that stores components including the integrated circuits 131 and 133, and the substrates 121 and 122. This housing 110 is formed of a good conductor (metal, etc.), the thermal conductivity of which is higher than a certain fixed value (for example, the thermal conductivity of water or air). This housing 110 is used as a heat dissipation member that radiates heat generated in the integrated circuits 131 and 133. In addition, it is assumed that the heat capacity of the housing 110 is larger than the sum of the heat capacities of the integrated circuit 133 and the plate 140. It should be noted that the housing 110 is an example of the heat dissipation member set forth in claims It should be noted that a heat dissipation member such as a heat dissipation sheet and a heat sink, other than the housing 110, may be used for cooling down the integrated circuits 131 and 133 so long as the heat capacity of the heat dissipation member is relatively large.

The substrate 121 is a circuit substrate on which the integrated circuit 131 is mounted; and the substrate 122 is a circuit substrate on which the integrated circuit 133 is mounted. It is assumed that heat transfer between the housing 110 and each of the integrated circuits 131 and 133 is blocked by an air space between the housing 110 and each of the substrates 121 and 122.

Each of the integrated circuits 131 and 133 is a circuit in which a plurality of circuit elements and wiring lines are integrated and built. It is assumed that the temperature increase speed of the integrated circuit 131 is higher than that of the integrated circuit 133. For example, the integrated circuit 131 is larger than the integrated circuit 133 in circuit size and processing amount. Alternatively, a frequency of an operation clock of the integrated circuit 131 is higher than that of the integrated circuit 133. The integrated circuit 133 and the plate 140 that are lower in temperature increase speed are used as heat dissipation members each radiating heat generated in the integrated circuit 131. It should be noted that the integrated circuit 131 is an example of the first circuit set forth in claims, and the integrated circuit 133 is an example of the second circuit set forth in claims.

The plate 140 is a joined member formed by joining the shape memory alloy 141 and the shape memory alloy 142 together by a joining method such as welding and pressure welding, the joining method maintaining heat transference. The plate 150 is a joined member formed by joining the shape memory alloy 141 and the shape memory alloy 142 together by welding or the like. In addition, the plate 140 is fixed to the integrated circuit 131 by an adhesive or a screw in a state in which a part of the plate 140 comes in contact with the integrated circuit 131. Moreover, the plate 150 is fixed to the integrated circuit 133 in a state in which a part of the plate 150 comes in contact with the integrated circuit 133. It should be noted that the plate 140 is an example of the joined member set forth in claims.

It should be noted that although the shape memory alloys 141 and 142 are joined together, the shape memory alloys 141 and 142 may be configured not to be joined together. In addition, the shape memory alloys 151 and 152 may be configured not to be joined together too. Even in the case of not being joined together, the shape memory alloys have only to be partially fixed to the integrated circuits 131 and 133 by an adhesive or the like.

When the temperature of the shape memory alloy 141 becomes higher than the transformation point T1, the shape memory alloy 141 deforms, and comes in contact with the housing 110. When the temperature of the shape memory alloy 141 becomes lower than or equal to the transformation point T1, the shape of the shape memory alloy 141 returns to an original shape before the deformation.

When the temperature of the shape memory alloy 142 becomes higher than the transformation point T2, the shape memory alloy 142 deforms, and comes in contact with the shape memory alloy 151. When the temperature of the shape memory alloy 142 becomes lower than or equal to the transformation point T2, the shape of the shape memory alloy 142 returns to an original shape before the deformation.

When the temperature of the shape memory alloy 151 becomes higher than the transformation point T3, the shape memory alloy 151 deforms into a shape that does not come in contact with the shape memory alloy 142 after the deformation. When the temperature of the shape memory alloy 151 becomes lower than or equal to the transformation point T3, the shape of the shape memory alloy 151 returns to an original shape before the deformation.

When the temperature of the shape memory alloy 152 becomes higher than the transformation point T4, the shape memory alloy 152 deforms, and comes in contact with the housing 110. When the temperature of the shape memory alloy 152 becomes lower than or equal to the transformation point T4, the shape of the shape memory alloy 152 returns to an original shape before the deformation.

In addition, in an X direction that is parallel to the housing 110, the shape memory alloys 141, 142, 151 and 152 deform at positions that differ from one another. It is assumed that the positions at which the shape memory alloys 141, 142, 151 and 152 deform are X1, X2, X3 and X4 respectively.

In addition, the shape memory alloys 141, 142, 151 and 152 are formed of a good conductor (for example, an alloy of titanium and nickel) having a thermal conductivity higher than a certain fixed value. Here, the transformation points T1, T2, T3 and T4 are set, for example, at values that satisfy the following relational expression:

$$T2<T3<T1<T4 \qquad \text{Expression 1}$$

It should be noted that T4 has only to be a temperature higher than T3, and therefore is not limited to a temperature higher than T1. For example, T4 may be a temperature that is the same as T1.

In addition, the shape memory alloy 141 is an example of the high-temperature-side deformation member or the first deformation member set forth in claims; and the shape memory alloy 142 is an example of the low-temperature-side deformation member or the second deformation member set forth in claims. Moreover, the shape memory alloy 151 is an example of the third deformation member set forth in claims; and the shape memory alloy 152 is an example of the fourth deformation member set forth in claims.

A state of the electronic device 100 in a of FIG. 1 corresponds to a state in which the temperature of the integrated circuit 131 is T2 or lower, and the temperature of the integrated circuit 133 is T3 or lower (for example, a state before the power is turned on). The shape memory alloy 141 in this state does not come in contact with the housing 110, and the shape memory alloy 142 does not come in contact with the shape memory alloy 151, either. In addition, the shape memory alloy 151 does not come in contact with the shape memory alloy 142, and the shape memory alloy 152 does not come in contact with the housing 110, either.

FIG. 2 shows diagrams each illustrating a cooling method at low temperature in the embodiment. Oblique line parts in FIG. 2 each indicate a part in which the temperature has increased. In FIG. 2, a shows, as an example, a cross-sectional view of the electronic device 100 obtained when a state of a of FIG. 1 shifts to a state in which the temperature of the integrated circuit 131 is higher than T2.

As described above, the temperature increase speed of the integrated circuit 133 is lower than that of the integrated circuit 131. Therefore, it is assumed that even in a state in which the temperature of the integrated circuit 131 is higher than T2, the temperature of the integrated circuit 133 continues to be T3 or lower. In this state, the shape memory alloy 142 deforms, and comes in contact with the shape memory alloy 151. This causes heat generated in the integrated circuit 131 to be transferred to the integrated circuit 133 through the plates 140 and 150, and consequently the integrated circuit 131 is cooled down.

In FIG. 2, b shows, as an example, a cross-sectional view of the electronic device 100 obtained when a state of a of FIG. 2 shifts to a state in which the temperature of the integrated circuit 133 is higher than T3. In this state, the shape memory alloy 151 deforms into a shape that does not come in contact with the shape memory alloy 142 after the deformation. This causes the heat transfer from the integrated circuit 131 to the integrated circuit 133 to be interrupted, and consequently the increase in temperature of the integrated circuit 133 is suppressed.

FIG. 3 shows diagrams each illustrating a cooling method at high temperature in the embodiment. Oblique line parts in which oblique lines intersect to form lattices in FIG. 3 each indicate a part in which the temperature has further increased in comparison with the state of FIG. 2. In FIG. 3, a shows, as an example, a cross-sectional view of the electronic device 100 obtained when a state of b of FIG. 2 shifts to a state in which the temperature of the integrated circuit 131 is higher than T1. In this state, the shape memory alloy 141 deforms, and comes in contact with the housing 110. This causes the heat generated in the integrated circuit 131 to be transferred to the housing 110 through the plate 140, and consequently the integrated circuit 131 is cooled down.

In FIG. 3, b shows, as an example, a cross-sectional view of the electronic device 100 obtained when a state of a of FIG. 3 shifts to a state in which the temperature of the integrated circuit 133 is higher than T4. In this state, the shape memory alloy 152 deforms, and comes in contact with the housing 110. This causes the heat generated in the integrated circuit 133 to be transferred to the housing 110 through the plate 150, and consequently the integrated circuit 133 is cooled down.

Here, a configuration in which only the shape memory alloy 141 from between the shape memory alloys 141 and 142 is provided is assumed as a comparative example for comparison. In this comparative example, a transformation point of the shape memory alloy 141 is changed to T2 that is lower when a comparison is made between T1 and T2. In this setting, when the shape memory alloy 141 deforms and comes in contact with the housing 110 under an environment in which the temperature of the housing 110 is very low (for example, 0 degrees or lower), there is a possibility that the temperature of the integrated circuit 131 will become too low. As the result, a phenomenon in which the delay time of the integrated circuit 131 is extremely lengthened, or a phenomenon in which the integrated circuit 131 does not start up, occurs. The phenomenon in which the operation of the circuit becomes unstable at low temperature in this manner is called low temperature worst.

In order to suppress this low temperature worst, if the transformation point of the shape memory alloy 141 is set at the temperature T1 that is higher, there is a possibility that the integrated circuit 131 will not be sufficiently cooled down in a temperature region up to the temperature T1, causing the operation of the integrated circuit 131 to become unstable.

Thus, there is a possibility that using only the shape memory alloy 141 will not be able to cool down the integrated circuit 131 to an appropriate temperature. Meanwhile, in a configuration shown in FIG. 3, in which the shape memory alloys 141 and 142 are provided, the temperature of the integrated circuit 131 sufficiently increases, and the shape memory alloy 141 comes in contact with the housing 110 in a stage in which the transformation point T1 is exceeded, and therefore the low temperature worst can be suppressed. In addition, when the transformation point T2 is exceeded in a temperature region up to the transformation point T1, the shape memory alloy 142 comes in contact with the shape memory alloy 151, and therefore the integrated circuit 131 can be sufficiently cooled down. This enables the integrated circuit 131 to be cooled down to a sufficiently low temperature with the low temperature worst suppressed.

In addition, when the temperature of the integrated circuit 133 exceeds T3, the shape memory alloy 151 deforms, and consequently interrupts heat transfer from the integrated circuit 131. Therefore, an increase in temperature of the integrated circuit 133 can be suppressed. Further, the temperature of the integrated circuit 133 sufficiently increases, and in a stage in which T4 is exceeded, the shape memory alloy 152 comes in contact with the housing 110. Therefore, the low temperature worst can be suppressed. By using the shape memory alloys 141, 142, 151 and 152, heat is properly transferred between the integrated circuits 131 and 133 that differ in temperature increase speed, which enables these circuits to be efficiently cooled down. In addition, the plates 140 and 150 do not require the electric power, and also have a small parts count in comparison with a cooling fan or the like, and therefore can be mounted to a small-sized portable device or the like at low cost.

Thus, according to the embodiment of the present technology, the shape memory alloy 141 comes in contact with the shape memory alloy 151 at the temperature T2, and the shape memory alloy 142 comes in contact with the housing 110 at the temperature T1. Therefore, heat can be transferred to the shape memory alloy 151 and the housing 110 at different temperatures. This enables the integrated circuit 131 to be cooled down to a sufficiently low temperature with the low temperature worst suppressed.

[First Modified Example]

In the above-described embodiment, the plates 140 and 150 are formed of the shape memory alloy 141 or the like. However, the plates 140 and 150 can also be formed of a member other than the shape memory alloy. The electronic device 100 in the first modified example differs from the electronic device 100 in the embodiment in that the plates are formed of a member other than the shape memory alloy.

Figure 4:
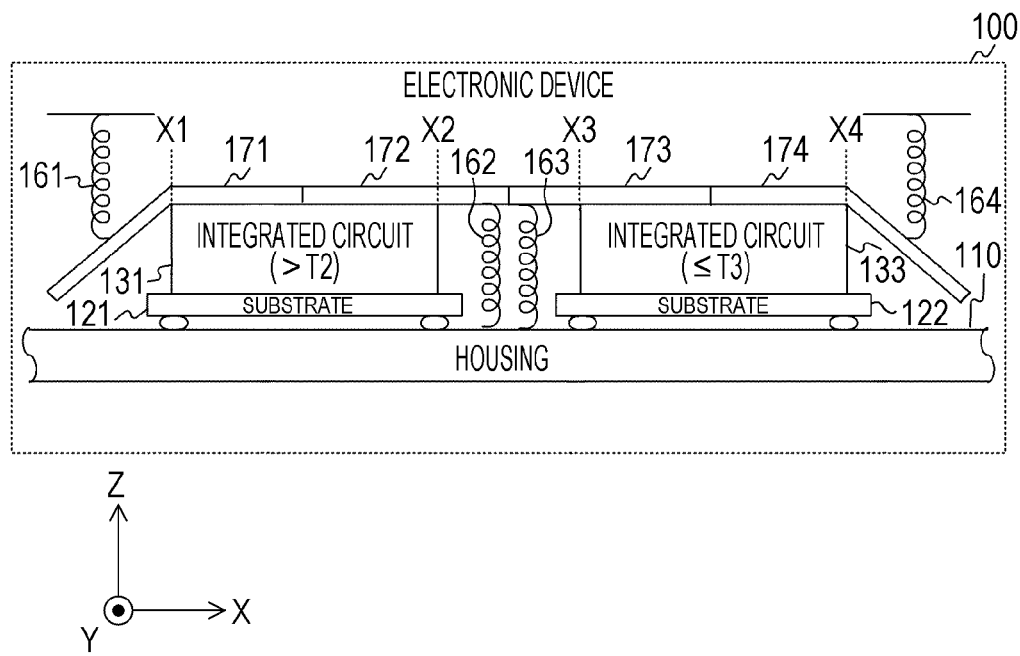
FIG. 4 shows, as an example, a cross-sectional view of an electronic device in a first modified example of the embodiment.

FIG. 4 shows, as an example, a cross-sectional view of the electronic device 100 in the first modified example of the embodiment. The electronic device 100 in the first modified example is provided with elastic members 171, 172, 173 and 174, and shape memory alloy springs 161, 162, 163 and 164, as an alternative to the shape memory alloys 141, 142, 151 and 152. The elastic member 171 is joined to the elastic member 172, and the elastic member 173 is joined to the elastic member 174.

When a stress is applied to the elastic member 171 in a direction toward the housing 110 along a Z-axis direction perpendicular to the housing 110, the elastic member 171 elastically deforms, and comes in contact with the housing 110. When the stress is removed, the elastic member 171 returns to an original shape that does not come in contact with the housing 110.

When a stress is applied to the elastic member 172 in a direction away from the housing 110 along the Z-axis direction, the elastic member 172 elastically deforms, and comes in contact with the elastic member 173. When the stress is removed, the elastic member 172 returns to an original shape that does not come in contact with the elastic member 173.

When a stress is applied to the elastic member 173 in a direction away from the housing 110 along the Z-axis direction, the elastic member 173 is elastically deformed into a shape that does not come in contact with the elastic member 172. When the stress is removed, the elastic member 173 returns to an original shape.

When a stress is applied to the elastic member 174 in a direction away from the housing 110 along the Z-axis direction, the elastic member 174 elastically deforms, and comes in contact with the housing 110. When the stress is removed, the elastic member 174 returns to an original shape that does not come in contact with the housing 110.

These elastic members 171, 172, 173 and 174 are formed of a good conductor (metal, etc.) having a thermal conductivity higher than a certain fixed value.

When the temperature of the shape memory alloy spring 161 exceeds the transformation point T1, the shape memory alloy spring 161 deforms, and consequently brings the elastic member 171 into contact with the housing 110. One end of the shape memory alloy spring 161 comes in contact with the elastic member 171, and the other end is fixed to a surface that faces the housing 110. In addition, when the transformation point T1 is exceeded, the shape memory alloy spring 161 is deformed into a shape having a length increasing in the Z-axis direction, and applies a stress to the elastic member 171. When the temperature of the shape memory alloy spring 161 becomes lower than or equal to the transformation point T1, the shape memory alloy spring 161 returns to an original shape before the deformation. It should be noted that the shape memory alloy spring 161 is an example of the high-temperature-side drive unit set forth in claims.

When the temperature of the shape memory alloy spring 162 exceeds the transformation point T2, the shape memory alloy spring 162 deforms, and consequently brings the elastic member 172 into contact with the elastic member 173. One end of the shape memory alloy spring 161 comes in contact with the elastic member 172, and the other end is fixed to the housing 110. In addition, when the transformation point T2 is exceeded, the shape memory alloy spring 162 is deformed into a shape having a length increasing in the Z-axis direction, and applies a stress to the elastic member 172. When the temperature of the shape memory alloy spring 162 becomes lower than or equal to the transformation point T2, the shape memory alloy spring 162 returns to an original shape before the deformation. It should be noted that the shape memory alloy spring 162 is an example of the low-temperature-side drive unit set forth in claims.

When the temperature of the shape memory alloy spring 163 exceeds the transformation point T3, the shape memory alloy spring 163 deforms, and consequently deforms the elastic member 173 into a shape that does not come in contact with the elastic member 172. One end of the shape memory alloy spring 163 comes in contact with the elastic member 173, and the other end is fixed to the housing 110. In addition, when the transformation point T3 is exceeded, the shape memory alloy spring 163 is deformed into a shape having a length increasing in the Z-axis direction, and applies a stress to the elastic member 173. When the temperature of the shape memory alloy spring 163 becomes lower than or equal to the transformation point T3, the shape memory alloy spring 163 returns to an original shape before the deformation.

When the temperature of the shape memory alloy spring 164 exceeds the transformation point T4, the shape memory alloy spring 164 deforms, and consequently brings the elastic member 174 into contact with the housing 110. One end of the shape memory alloy spring 164 comes in contact with the elastic member 174, and the other end is fixed to a surface that faces the housing 110. In addition, when the transformation point T4 is exceeded, the shape memory alloy spring 164 is deformed into a shape having a length increasing in the Z-axis direction, and applies a stress to the elastic member 174. When the temperature of the shape memory alloy spring 164 becomes lower than or equal to the transformation point T4, the shape memory alloy spring 164 returns to an original shape before the deformation.

It should be noted that at least one of the elastic members 171, 172, 173 and 174 can also be replaced with the shape memory alloy 141 or the like of the first embodiment. In this case, the need for a shape memory alloy spring corresponding to the replaced elastic member is eliminated.

Thus, according to the first modified example of the present technology, the shape memory alloy spring 162 brings the elastic members into contact with each other at temperature T2, and the shape memory alloy spring 161 brings the elastic member into contact with the housing 110 at temperature T1. Therefore, the heat can be transferred by the shape memory alloy springs and the elastic members.

[Second Modified Example]

In the above-described first modified example, the elastic members 171 or the like is deformed by the shape memory alloy spring 161 or the like. However, the elastic member 171 or the like can also be deformed by components other than the shape memory alloy springs. The electronic device 100 in the second modified example differs from that in the first modified example in that the elastic member 171 or the like is deformed by components other than the shape memory alloy springs.

Figure 5:
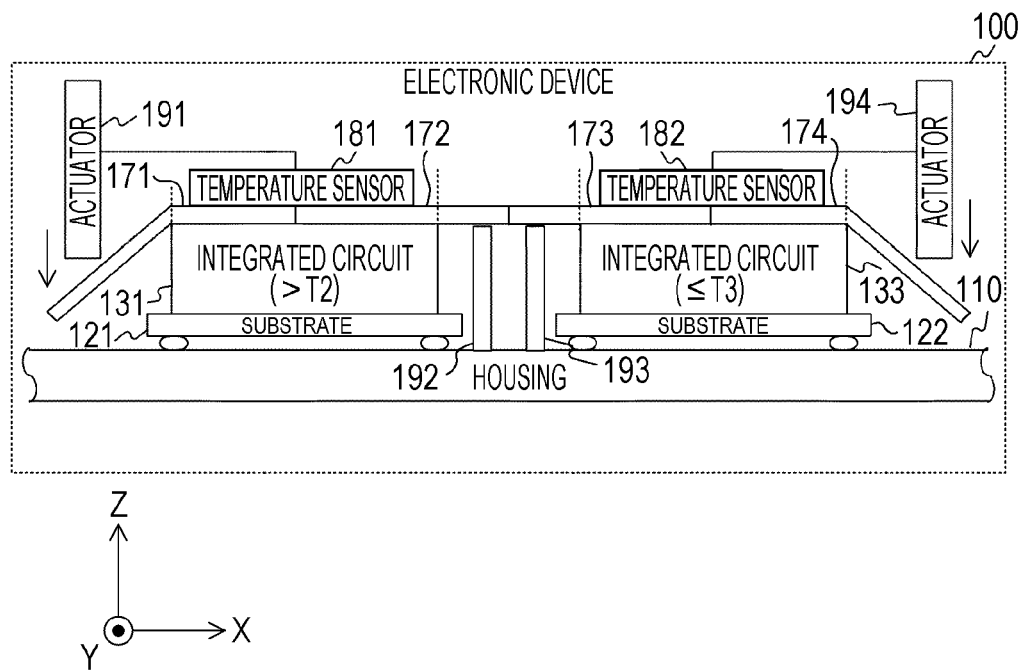
FIG. 5 shows, as an example, a cross-sectional view of an electronic device in a second modified example of the embodiment.

FIG. 5 shows, as an example, a cross-sectional view of the electronic device 100 in the second modified example of the embodiment. The electronic device 100 in the second modified example differs from that in the first modified example in that the electronic device 100 in the second modified example is provided with actuators 191, 192, 193 and 194, and temperature sensors 181 and 182 as an alternative to the shape memory alloy springs 161, 162, 163 and 164.

The temperature sensor 181 measures the temperature of the integrated circuit 131 through the elastic members 171 and 172. When a measured value of the temperature sensor 181 exceeds T1, the temperature sensor 181 supplies a control signal to the actuator 191 to cause the actuator 191 to be driven in a direction toward the housing 110. Meanwhile, when the measured value becomes T1 or lower, the temperature sensor 181 causes the actuator 191 to be driven in a direction away from the housing 110. In addition, when the measured value of the temperature sensor 181 exceeds T2, the temperature sensor 181 supplies a control signal to the actuator 192 to cause the actuator 192 to drive in a direction away from the housing 110. Meanwhile, when the measured value becomes T2 or lower, the temperature sensor 181 causes the actuator 192 to drive in a direction toward the housing 110.

The temperature sensor 182 measures the temperature of the integrated circuit 133 through the elastic members 173 and 174. When a measured value of the temperature sensor 182 exceeds T3, the temperature sensor 182 supplies a control signal to the actuator 193 to cause the actuator 193 to drive in a direction away from the housing 110. Meanwhile, when the measured value becomes T3 or lower, the temperature sensor 182 causes the actuator 193 to drive in a direction toward the housing 110. In addition, when the measured value of the temperature sensor 182 exceeds T4, the temperature sensor 182 supplies a control signal to the actuator 194 to cause the actuator 194 to drive in a direction toward the housing 110. Meanwhile, when the measured value becomes T4 or lower, a temperature sensor 183 causes the actuator 194 to drive in a direction away from the housing 110.

The actuator 191 deforms according to a control signal from the temperature sensor 181, and brings the elastic member 171 into contact with the housing 110. For example, the actuator 191 expands and contracts along the Z-axis direction, and consequently a stress is applied to the elastic member 171 to bring the elastic member 171 into contact with the housing 110. It should be noted that the actuator 191 is an example of the high-temperature-side drive unit set forth in claims.

The actuator 192 deforms according to a control signal from the temperature sensor 181, and brings the elastic member 172 into contact with the elastic member 173. It should be noted that the actuator 192 is an example of the low-temperature-side drive unit set forth in claims.

The actuator 193 deforms according to a control signal from the temperature sensor 182, and deforms the elastic member 173 into a shape that does not come in contact with the elastic member 172. The actuator 194 deforms according to a control signal from the temperature sensor 182, and brings the elastic member 174 into contact with the housing 110.

For example, solenoid actuators or linear actuators are used as the actuators 191, 192, 193 and 194. It should be noted that actuators other than solenoid actuators or the like can also be used as the actuators 191, 192, 193 and 194 so long as the actuators other than solenoid actuators or the like each expand and contract according to a control signal.

It should be noted that at least one of the elastic members 171, 172, 173 and 174 can also be replaced with the shape memory alloy 141 or the like of the embodiment. In this case, the need for an actuator corresponding to the replaced elastic member is eliminated.

In addition, at least one of the actuators 191, 192, 193 and 194 can also be replaced with the shape memory alloy spring of the first modified example. In this case, the need for an actuator corresponding to the replaced elastic member is eliminated.

Thus, according to the second modified example of the present technology, the actuator 192 brings the elastic members into contact with each other at temperature T2, and the actuator 191 brings the elastic member 172 into contact with the housing 110 at temperature T1. Therefore, the heat can be transferred by the actuators and the elastic members.

[THIRD MODIFIED EXAMPLE]

In the above-described embodiment, the plates 140 and 150 each cool down one integrated circuit. However, the configuration in which each plate is provided with one integrated circuit creates a possibility that the number of plates will increase with the increase in number of integrated circuits. The electronic device 100 in the third modified example differs from that in the embodiment in that an increase in number of plates is suppressed.

Figure 6:
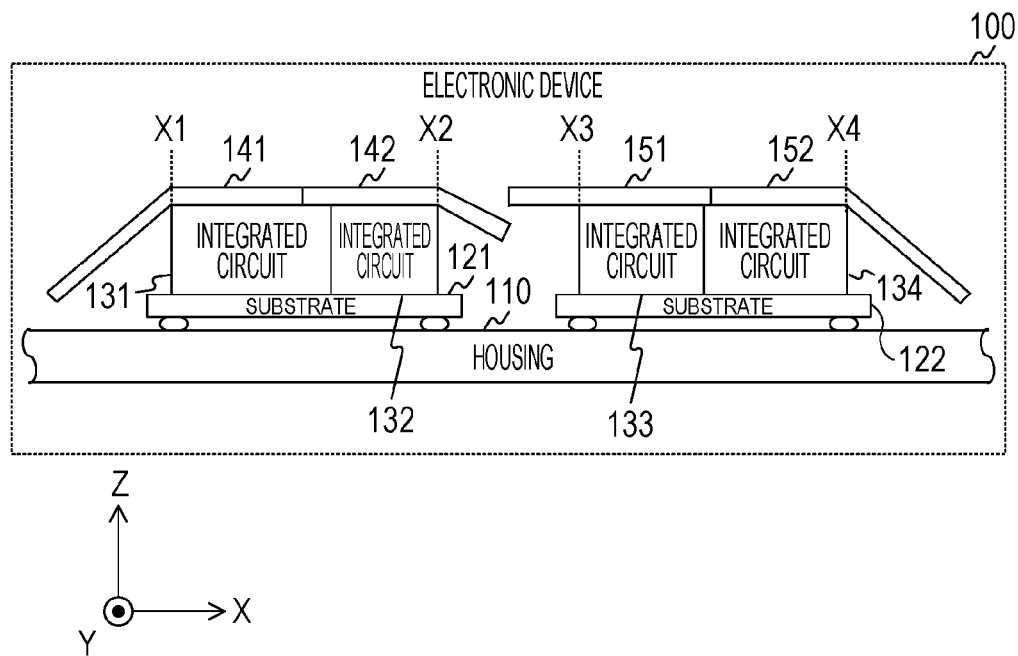
FIG. 6 shows, as an example, a cross-sectional view of an electronic device in a third modified example of the embodiment.

FIG. 6 shows, as an example, a cross-sectional view of the electronic device 100 in the third modified example of the embodiment. The electronic device 100 in the third modified example differs from that in the embodiment in that the electronic device 100 in the third modified example is further provided with integrated circuits 132 and 134.

The integrated circuit 132 is mounted to the substrate 121 together with the integrated circuit 131, and the integrated circuit 134 is mounted to the substrate 122 together with the integrated circuit 133. In addition, the plate 140 cools down the integrated circuits 131 and 132, and the plate 150 cools down the integrated circuits 133 and 134.

It should be noted that although the plates 140 and 150 are each provided with two integrated circuits, the plates 140 and 150 may be each provided with three or more integrated circuits. In addition, the integrated circuits may be connected to each other with a connector.

Thus, according to the third modified example of the present technology, each plate is provided with a plurality of integrated circuits, and therefore an increase in number of plates resulting from an increase in number of integrated circuits can be suppressed.

[Fourth Modified Example]

In the above-described embodiment, the plate 140 transfers heat from the integrated circuit 131 to the integrated circuit 133. However, there is a possibility that the heat from the integrated circuit 131 will cause the temperature of the integrated circuit 133 to increase, and consequently the operation of the integrated circuit 133 will become unstable. The electronic device 100 in the fourth modified example differs from that in the embodiment in that the heat transfer between the integrated circuits is suppressed.

Figure 7:
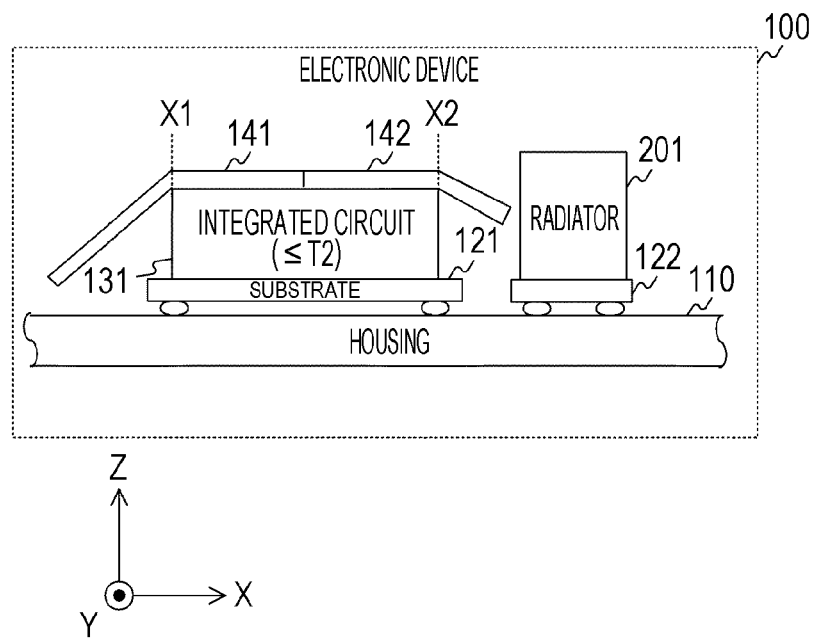
FIG. 7 shows, as an example, a cross-sectional view of an electronic device in a fourth modified example of the embodiment.

FIG. 7 shows, as an example, a cross-sectional view of the electronic device 100 in the fourth modified example of the embodiment. The electronic device 100 in the fourth modified example differs from that in the first embodiment in that the electronic device 100 in the fourth modified example is not provided with the plate 150, and is further provided with a radiator 201. In FIG. 7, the integrated circuit 133 is omitted.

In addition, when the transformation point T2 is exceeded, the shape memory alloy 142 in the fourth modified example deforms, and comes in contact with the radiator 201.

The radiator 201 radiates heat from the integrated circuit 131 into the housing 110. It is assumed that the heat capacity of the radiator 201 is smaller than that of the housing 110. For example, a heat dissipation sheet, a heat sink or the like is used as the radiator 201. It should be noted that the radiator 201 is an example of the heat dissipation member set forth in claims.

Thus, according to the fourth modified example of the present technology, the shape memory alloy 142 deforms, and transfers the heat from the integrated circuit 131 to the radiator 201, and therefore an increase in temperature of the integrated circuit 133 can be suppressed.

[Fifth Modified Example]

In the above-described embodiment, the shape memory alloy 142 deforms, and transfers the heat from the integrated circuit 131 to the integrated circuit 133. However, there is a possibility that the heat from the integrated circuit 131 will cause the operation of the integrated circuit 133 to become unstable. The electronic device 100 in the fourth modified example differs from that in the embodiment in that cooling of the integrated circuit 133 is facilitated.

Figure 8:
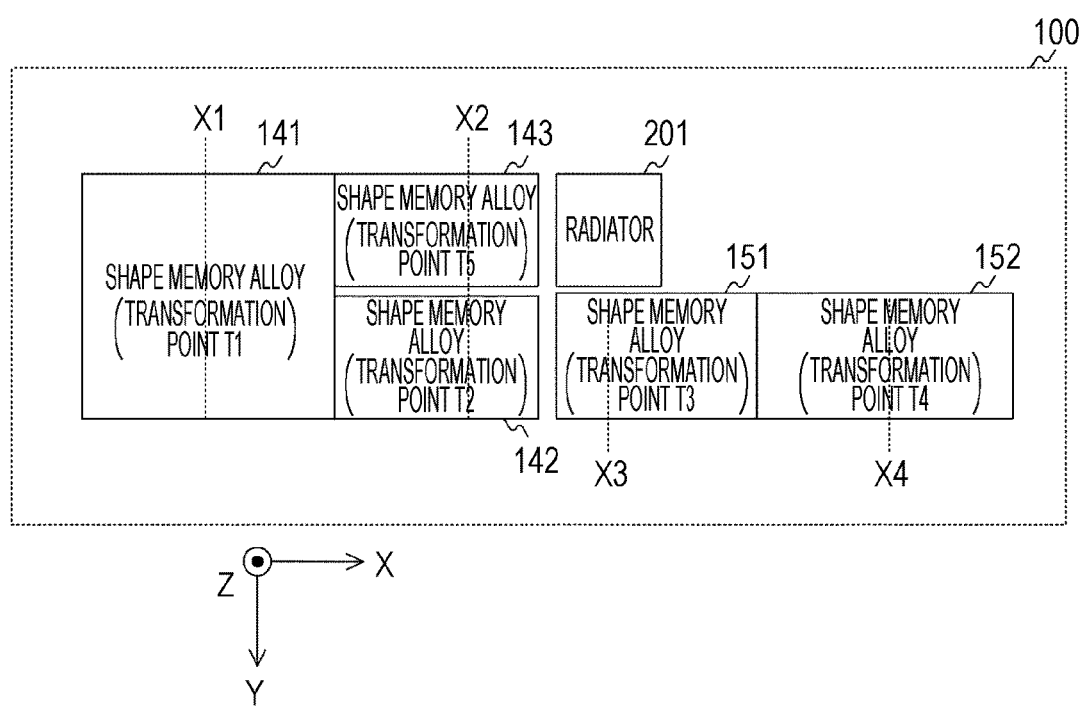
FIG. 8 shows, as an example, a top view of an electronic device in a fifth modified example of the embodiment.

FIG. 8 shows, as an example, a top view of the electronic device 100 in the fifth modified example of the embodiment. The electronic device 100 in the fifth modified example differs from that in the embodiment in that the electronic device 100 in the fifth modified example is further provided with a shape memory alloy 143 and the radiator 201.

The shape memory alloy 143 deforms at a transformation point T5, and comes in contact with the radiator 201. Here, T5 is a temperature that is higher than T2, and is lower than T1. In addition, this shape memory alloy 143 is joined to the shape memory alloy 141. The radiator 201 radiates heat from the integrated circuit 131. It should be noted that although one integrated circuit is provided with three shape memory alloys (141, 142 and 143), one integrated circuit may be provided with four or more shape memory alloys.

When the temperature T5 is reached, the shape memory alloy 143 comes in contact with the radiator 201, and consequently the heat is transferred from the integrated circuit 131 to the radiator 201. This enables an increase in temperature of the integrated circuits 131 and 133 to be suppressed.

It should be noted that at least one of the shape memory alloys 141, 142, 143, 151 and 155 can also be replaced with the elastic member 171 or the like of the first modified example. In this case, a shape memory alloy spring corresponding to the replaced elastic member is further provided.

In addition, at least one of the shape memory alloys 141, 142, 143, 151 and 155 can also be replaced with the elastic member 171 or the like of the second modified example. In this case, an actuator and a temperature sensor, each corresponding to the replaced elastic member, are further provided.

Thus, according to the fifth modified example of the present technology, the one integrated circuit 131 is cooled down by the three shape memory alloys (141, 142 and 143), and therefore the integrated circuits 131 and 133 can be more efficiently cooled down.

It should be noted that the above embodiment is described as an example for realizing the present technology, and the matters in the embodiment and the invention defining matters in claims respectively have correspondence relationships therebetween. Similarly, the invention defining matters in claims, and the matters in the embodiment of the present technology, which have the same names as those of the invention defining matters in claims respectively, have respective correspondence relationships therebetween. However, the present technology is not limited to the embodiment, and the present technology can be realized by making various kinds of modifications to the embodiment within the scope that does not deviate from the gist thereof.

It should be noted that the effect described herein is not necessarily limited, and may be any one of the effects described in the present disclosure.

It should be noted that the present technology can also employ the following configurations.

(1) An electronic device including:
a low-temperature-side deformation member, when a temperature of a circuit to be cooled becomes higher than a set temperature that is lower between two different set temperatures, the low-temperature-side deformation member deforming, and coming in contact with a heat dissipation member having a smaller heat capacity between two heat dissipation members having different heat capacities; and
a high-temperature-side deformation member, when the temperature of the circuit becomes higher than a set temperature that is higher between the two different set temperatures, the high-temperature-side deformation member deforming, and coming in contact with a heat dissipation member having a larger heat capacity between the two heat dissipation members.

(2) The electronic device set forth in the above (1), in which at least one of the low-temperature-side deformation member and the high-temperature-side deformation member is a shape memory alloy.

(3) The electronic device set forth in the above (1), including:
a low-temperature-side drive unit, when the temperature of the circuit becomes higher than the set temperature that is lower between the two different set temperatures, the low-temperature-side drive unit deforming the low-temperature-side deformation member; and
a high-temperature-side drive unit, when the temperature of the circuit becomes higher than the set temperature that is higher between the two different set temperatures, the high-temperature-side drive unit deforming the high-temperature-side deformation member.

(4) The electronic device set forth in the above (3), in which at least one of the low-temperature-side drive unit and the high-temperature-side drive unit is a shape memory alloy.

(5) The electronic device set forth in the above (3), further including a temperature sensor that measures the temperature of the circuit, and causes at least one of the low-temperature-side drive unit and the high-temperature-side drive unit to be driven on the basis of the measured value.

(6) The electronic device set forth in any one of the above (1) to (5), in which the heat dissipation member having a larger heat capacity between the two heat dissipation members is a housing that stores the low-temperature-side deformation member and the high-temperature-side deformation member.

(7) An electronic device including:
a first deformation member, when a temperature of a first circuit becomes higher than a first set temperature, the first deformation member deforming, and coming in contact with a predetermined heat dissipation member;
a second deformation member, when the temperature of the first circuit becomes higher than a second set temperature that is lower than the first set temperature, the second deformation member deforming;
a third deformation member, when a temperature of a second circuit becomes higher than a third set temperature that is between the first set temperature and the second set temperature, the third deformation member deforming into a shape that does not come in contact with the second deformation member after the deformation; and
a fourth deformation member, when the temperature of the second circuit becomes higher than a fourth set temperature that is higher than the third set temperature, the fourth deformation member deforming, and coming in contact with the predetermined heat dissipation member.

(8) A joined member that is formed by joining together: a low-temperature-side deformation member, when a temperature of a circuit to be cooled becomes higher than a set temperature that is lower between two different set temperatures, the low-temperature-side deformation member deforming, and coming in contact with a heat dissipation member having a smaller heat capacity between two heat dissipation members having different heat capacities; and a high-temperature-side deformation member, when the temperature of the circuit becomes higher than a set temperature that is higher between the two different set temperatures, the high-temperature-side deformation member deforming, and coming in contact with a heat dissipation member having a larger heat capacity between the two heat dissipation members.

REFERENCE SIGNS LIST

100 Electronic device
110 Housing
121, 122 Substrate
131, 132, 133, 134 Integrated circuit
140, 150 Plate
141, 142, 143, 151, 152 Shape memory alloy
161, 162, 163, 164 Shape memory alloy spring
171, 172, 173, 174 Elastic member
181, 182, 183, 184 Temperature sensor
191, 192, 193, 194 Actuator
201 Radiator

What is claimed is:

1. An electronic device comprising:
    a low-temperature-side deformation member, wherein when a temperature of a circuit to be cooled becomes higher than a set temperature that is lower between two different set temperatures, the low-temperature-side deformation member deforms, and comes in contact with a heat dissipation member having a smaller heat capacity between two heat dissipation members having different heat capacities; and
    a high-temperature-side deformation member, wherein when the temperature of the circuit becomes higher than a set temperature that is higher between the two different set temperatures, the high-temperature-side deformation member deforms, and comes in contact with a heat dissipation member having a larger heat capacity between the two heat dissipation members.

2. The electronic device according to claim 1, wherein at least one of the low-temperature-side deformation member and the high-temperature-side deformation member is a shape memory alloy.

3. The electronic device according to claim 1, further comprising:
    a low-temperature-side drive unit, wherein when the temperature of the circuit becomes higher than the set temperature that is lower between the two different set temperatures, the low-temperature-side drive unit deforms the low-temperature-side deformation member; and
    a high-temperature-side drive unit, wherein when the temperature of the circuit becomes higher than the set temperature that is higher between the two different set temperatures, the high-temperature-side drive unit deforms the high-temperature-side deformation member.

4. The electronic device according to claim 3, wherein at least one of the low-temperature-side drive unit and the high-temperature-side drive unit is a shape memory alloy.

5. The electronic device according to claim 3, further comprising a temperature sensor that measures the temperature of the circuit, and causes at least one of the low-temperature-side drive unit and the high-temperature-side drive unit to be driven on the basis of the measured value.

6. The electronic device according to claim 1, wherein the heat dissipation member having a larger heat capacity between the two heat dissipation members is a housing that stores the low-temperature-side deformation member and the high-temperature-side deformation member.

7. An electronic device comprising:
    a first deformation member, wherein when a temperature of a first circuit becomes higher than a first set temperature, the first deformation member deforms, and comes in contact with a predetermined heat dissipation member;
    a second deformation member, wherein when the temperature of the first circuit becomes higher than a second set temperature that is lower than the first set temperature, the second deformation member deforms;
    a third deformation member, wherein when a temperature of a second circuit becomes higher than a third set temperature that is between the first set temperature and the second set temperature, the third deformation member deforms into a shape that does not come in contact with the second deformation member after the deformation; and
    a fourth deformation member, wherein when the temperature of the second circuit becomes higher than a fourth set temperature that is higher than the third set temperature, the fourth deformation member deforms, and comes in contact with the predetermined heat dissipation member.

8. A joined member that is formed by joining together: a low-temperature-side deformation member, wherein when a temperature of a circuit to be cooled becomes higher than a set temperature that is lower between two different set temperatures, the low-temperature-side deformation member deforms, and comes in contact with a heat dissipation member having a smaller heat capacity between two heat dissipation members having different heat capacities; and a high-temperature-side deformation member, wherein when the temperature of the circuit becomes higher than a set temperature that is higher between the two different set temperatures, the high-temperature-side deformation member deforms, and comes in contact with a heat dissipation member having a larger heat capacity between the two heat dissipation members.

* * * * *